United States Patent
Finlay, Sr. et al.

(10) Patent No.: US 6,430,017 B1
(45) Date of Patent: Aug. 6, 2002

(54) THERMAL PROTECTION FOR SURGE SUPPRESSORS

(75) Inventors: David Alan Finlay, Sr., Marietta; Patrick John Murphy, Marcellus; Thomas N. Packard, Syracuse, all of NY (US)

(73) Assignee: Pass & Seymour, Inc., Syracuse, NY (US)

( * ) Notice: Subject to any disclaimer, the term of this patent is extended or adjusted under 35 U.S.C. 154(b) by 340 days.

(21) Appl. No.: 08/967,152

(22) Filed: Nov. 10, 1997

(51) Int. Cl.[7] .................................................. H02H 3/20
(52) U.S. Cl. ......................................... 361/104; 361/56
(58) Field of Search ............................... 361/54, 56, 91, 361/103, 104, 111, 117, 118, 119, 124, 125, 131, 132; 337/4, 5, 15, 17

(56) References Cited

U.S. PATENT DOCUMENTS

| | | | | |
|---|---|---|---|---|
| 4,652,964 A | * | 3/1987 | Ziegenbein | 361/54 |
| 4,739,436 A | * | 4/1988 | Stefani et al. | 361/56 |
| 4,808,965 A | * | 2/1989 | Cenky | 337/408 |
| 4,866,560 A | * | 9/1989 | Allina | 361/104 |
| 5,583,734 A | * | 12/1996 | McMills et al. | 361/124 |

* cited by examiner

Primary Examiner—Kim Huynh
(74) Attorney, Agent, or Firm—Wall Marjama & Bilinski LLP

(57) ABSTRACT

A thermal protective fuse having a cylindrical body with a thermally protective portion disposed substantially adjacent to one end of the cylindrical body is mounted in close proximity with the body of a metal oxide varistor, with the thermally responsive portion of the fuse positioned approximately adjacent the center of the varistor body.

7 Claims, 1 Drawing Sheet

THERMAL PROTECTION FOR SURGE SUPPRESSORS

FIELD OF THE INVENTION

This invention relates generally to the suppression of transient voltages, and more particularly to an improved thermal fusing arrangement for protecting transient voltage surge protectors of the varistor type, most particularly the metal oxide varistor type.

BACKGROUND OF THE INVENTION

Varistors, more particularly metal oxide varistors, have been used to protect electrical circuits from the deleterious effects of transient voltage spikes for many years. Metal oxide varistors, more particularly zinc oxide varistors, have the capability of clamping high transient voltages appearing on unconditioned power lines to a low level for protecting electrical equipment or devices connected to the line.

In the simplest arrangement, a metal oxide varistor can simply be connected between the hot and neutral conductors of a single phase electrical circuit, in parallel between the line and the load. Transient voltages exceeding the threshold voltage of the varistor are shunted by the varistor.

While metal oxide varistors have a long life, and have the ability to repeatedly clamp high transient voltage spikes to a safe level, they do eventually fail and ultimately, even if a catastrophic failure does not occur, the impedance of metal oxide varistors decreases to the point where they present a significant load, and eventually overheat and fail emitting smoke and fumes.

It is known to provide protection for metal oxide varistors by connecting the varistors across the power line in series with a current limiting fuse and/or a thermal fuse. If the impedance of the varistor decreases to the point where a current in excess of the designed current for the current limiting fuse is exceeded, the fuse will open and the varistor will be effectively removed from the circuit. Similarly, even if the current does not rise to a level sufficient to open the current limiting fuse, if the temperature of the varistor increases beyond the rated temperature of the thermal-fuse, the thermal fuse will open, thereby removing the varistor from the circuit.

The thermal-fuses heretofore used to protect electrical circuits from varistor failure are generally cylindrical in shape, and have been mounted on the same printed circuit boards to which the varistor is mounted with the cylindrical body of the fuse arranged adjacent and parallel to the varistor body. As long as the thermal protective fuse is physically close enough to the varistor, an increase in varistor temperature will increase the temperature of the thermal protective fuse, causing it to open. Even though thermal protective fuses of the type heretofore used to protect electrical circuits from varistor failure have been somewhat effective, varistors may overheat in failure at a physical location on the varistor body, that is remote from the thermal protective fuse. FIG. 1 shows a printed circuit board to which a metal oxide varistor and a cylindrical thermal protective fuse are mounted. As long as the varistor body overheats sufficiently at a location close to the fuse, the fuse will be effective. However, if localized overheating occurs at a portion of the varistor body remote from the fuse, the varistor and surrounding areas may be substantially destroyed before the temperature at the location of the fuse increases sufficiently to cause the fuse to open.

Accordingly, it is an object of this invention to provide a thermal protective arrangement for metal oxide varistors that overcomes the problems just mentioned. Briefly stated, and in accordance with a presently preferred aspect of the invention, thermal protective fuse having a cylindrical body with a thermally protective portion disposed substantially adjacent to one end of the cylindrical body is mounted in close proximity with the body of a metal oxide varistor, with the thermally responsive portion of the fuse positioned approximately adjacent the center of the varistor body.

In accordance with another aspect of this invention, the cylindrical body of the thermally responsive fuse is arranged substantially vertically with the thermally responsive portion on top relative to the printed circuit board, generally adjacent the center of the varistor body.

BRIEF DESCRIPTION OF THE DRAWINGS

While the novel aspects of the invention are set forward with particularity, the invention itself, together with further objects and advantages thereof, may be more readily comprehended by reference to the following detailed description of a presently preferred embodiment of the invention taken in conjunction with the accompanying drawings, in which.

DETAILED DESCRIPTION OF THE PREFERRED EMBODIMENT

Figure 2:
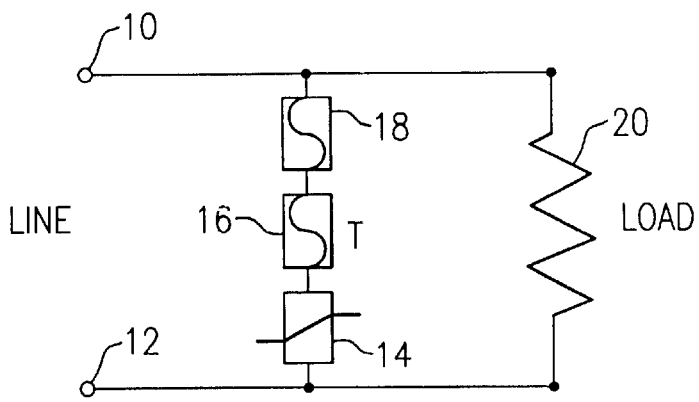
FIG. 2 is a schematic diagram of a metal oxide varistor together with protective fuses in, accordance with this invention.

Referring now to FIG. 2, an electrical circuit includes two electrical conductors attached to a power source, designated line, for convenience. Conductor 10 is the hot electrical conductor and conductor 12 is the neutral conductor. It is understood that one or more conductors, such as a ground conductor, may also be provided and additional varistors may be connected between the hot and neutral conductors and ground.

A metal oxide varistor 14 is connected in series with a thermal fuse 16, and a current limiting fuse 18, between the hot and neutral conductors. A load, designated schematically by resistor 20, is also connected between the hot and neutral conductors. In operation, voltage transients appearing on the line that exceed the threshold voltage of the varistor are suppressed by the metal oxide varistor, as long as fuses 16 and 18 remain intact.

If metal oxide varistor 14 fails, to the extent that either the current limit of fuse 18 or the temperature limit of fuse 16 is exceeded, one or both of fuses 16 or 18 will open, thereby removing the varistor from the circuit.

Figure 1:
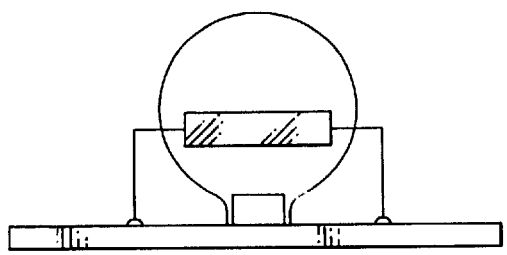
FIG. 1 is a diagram of the combination of a metal oxide varistor and a thermal fuse according to the prior art.
Figure 3:
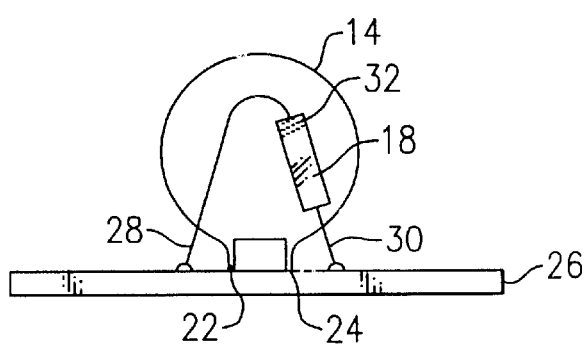
FIG. 3 is a diagrammatic view of a metal oxide varistor and a thermally protective fuse positioned adjacent thereto in accordance with the invention.
Figure 4:
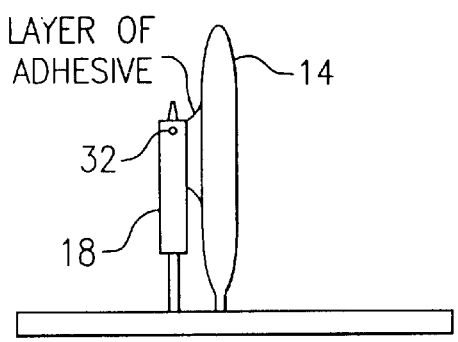
FIG. 4 is a diagrammatic view of a metal oxide varistor and a thermally responsive fuse orthogonal to the view of FIG. 3

FIG. 3 shows the physical placement of varistor 14 and fuse 18 on a printed circuit board. Metal oxide varistor 14 has first and second leads 22 and 24 connected conventionally to printed circuit traces on a printed circuit board 26, also of conventional design. A thermally responsive fuse 18 has first and second leads 28 and 30, which are also connected to traces on printed circuit board 26 to effectuate the schematic arrangement shown in FIG. 1.

Fuse 18 has a generally cylindrical body with a thermally responsive portion 32 the thermally responsive fuse located generally at one end of the body. Fuse 18 is arranged with respect to varistor 14, so that the thermally responsive portion 32 is positioned generally adjacent the center of the body of varistor 14.

In accordance with a preferred embodiment of this invention, the thermally responsive fuse is attached to varistor 14 with a layer of thermally conductive epoxy or other high thermal conductivity adhesive, such as Epocap 15144A/Epocure 114B two component epoxy available from Hardeman Division of Harcros Chemicals, Inc., Belleville, N.J. Preferably, a layer of uncured epoxy is applied to the body of the varistor and the thermally responsive fuse is positioned on the layer with the thermally responsive portion generally adjacent the center of the body of the varistor.

A thermally responsive fuse arranged in accordance with this invention provides a significantly improved response to overheating the varistor body wherever the overheating occurs. By positioning the thermally responsive portion of the fuse adjacent the center of the varistor body, the sum of the distances between the responsive portion and possible failure points on the resistor body is minimized.

Applicants have found that failures in the metal oxide varistors are detected more reliably and more quickly by the arrangement shown in FIG. 3 than has heretofore been possible.

Those skilled in the art will recognize that many modifications and changes may be made in the invention, without departing from the true spirit and scope thereof, which accordingly is intended to be defined solely by the appended claims.

What is claimed is:

1. A transient voltage suppressor for an electrical circuit comprising:

a varistor having a varistor body;

a thermal fuse having a thermally responsive element disposed within a fuse body, the fuse mounted with respect to the varistor so that the thermally responsive element is approximately adjacent the geometrical center of the varistor body; and a layer of adhesive between the varistor body and the thermal fuse.

2. The transient voltage surge suppressor of claim 1 in which the layer of adhesive is a layer of high thermal conductivity adhesive.

3. The transient voltage surge suppressor of claim 2 in which the layer of adhesive is a thermally conductive epoxy.

4. A transient voltage surge suppressor for an electrical circuit comprising:

a varistor having a varistor body; a thermally conductive adhesive material; and a thermal fuse having a thermally responsive end disposed within a fuse body, the fuse mounted with respect to the varistor so that the thermally responsive end is approximately adjacent the geometrical center of the varistor body, the thermally conductive adhesive material adheres the thermally responsive end to the varistor body.

5. A transient voltage surge suppressor for an electrical circuit comprising:

a varistor having a generally disk shaped varistor body arranged generally perpendicular to a printed circuit wiring board and first and second leads connected to the printed circuit wiring board, and a thermal fuse having first and second generally axial leads and a thermally responsive element disposed adjacent one end within a generally cylindrical fuse body, the fuse being mounted so that the thermally responsive element is located disposed away from the printed circuit wiring board and the other end of the thermal fuse being mounted proximate to the printed circuit wiring board, the fuse mounted with respect to the varistor so that the thermally responsive element is approximately adjacent the geometrical center of the varistor body.

6. The transient voltage surge suppressor of claim 5 in which the thermal fuse is oriented generally vertically.

7. The transient voltage surge suppressor of claim 5 in which the thermal fuse is oriented at an angle between 45 degrees and 90 degrees with respect to the printed circuit wiring board.

* * * * *